United States Patent
Tomita et al.

(10) Patent No.: US 7,221,574 B2
(45) Date of Patent: May 22, 2007

(54) SEMICONDUCTOR STORAGE DEVICE

(75) Inventors: Hiroyoshi Tomita, Kawasaki (JP);
Toshiya Uchida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 26 days.

(21) Appl. No.: 11/103,551

(22) Filed: Apr. 12, 2005

(65) Prior Publication Data

US 2005/0180242 A1    Aug. 18, 2005

Related U.S. Application Data

(63) Continuation of application No. PCT/JP03/05932, filed on May 13, 2003.

(51) Int. Cl.
*G11C 7/00* (2006.01)
(52) U.S. Cl. .................................. 365/22; 365/207
(58) Field of Classification Search ................ 365/222, 365/205, 207, 218, 202, 189.06, 189.07
See application file for complete search history.

(56) References Cited

U.S. PATENT DOCUMENTS

| | | |
|---|---|---|
| 5,418,753 A | 5/1995 | Seki |
| 5,668,762 A | 9/1997 | Suwa |
| 6,058,061 A | 5/2000 | Ooishi |
| 6,362,989 B2 * | 3/2002 | Tanaka et al. ............... 365/45 |
| 6,434,075 B2 | 8/2002 | Ooishi |
| 7,002,868 B2 * | 2/2006 | Takahashi ................... 365/222 |
| 2002/0018386 A1 | 2/2002 | Ooishi |
| 2002/0186598 A1 | 12/2002 | Ooishi |

FOREIGN PATENT DOCUMENTS

| | | |
|---|---|---|
| JP | 6-150646 | 5/1994 |
| JP | 8-161888 | 6/1996 |
| JP | 9-63266 | 3/1997 |

* cited by examiner

*Primary Examiner*—Anh Phung
*Assistant Examiner*—Hien N Nguyen
(74) *Attorney, Agent, or Firm*—Arent Fox LLC.

(57) ABSTRACT

A semiconductor storage device has a memory cell (501, 502) storing data; bit lines (BL1, BL2) connected to the memory cell, allowing therethrough data input or output to or from the memory cell; a sense amplifier (506a) connected to said bit lines, amplifying data on the bit lines; and a switching transistor (505a) connecting or disconnecting the bit line connected to the memory cell to or from the bit line connected to the sense amplifier. The switching transistor operates differently in a first memory cell access operation and in a second memory cell access operation.

23 Claims, 11 Drawing Sheets

F I G. 2
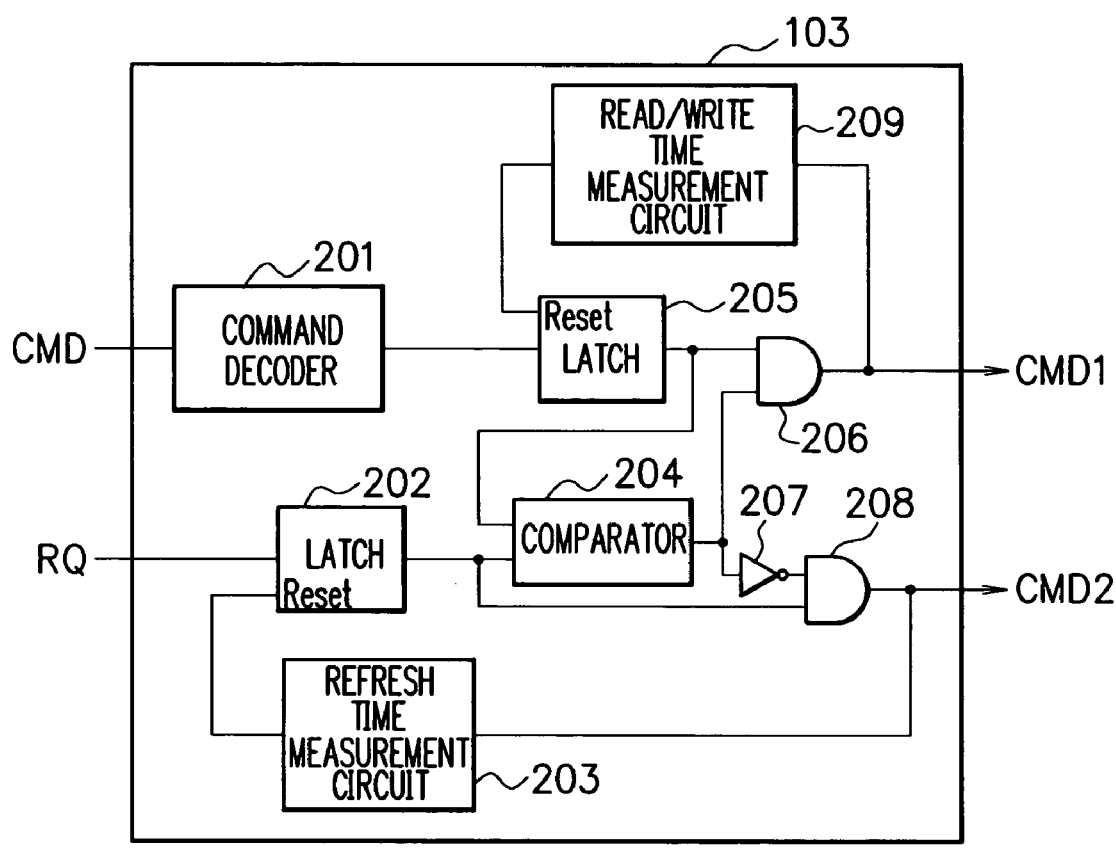

F I G. 10
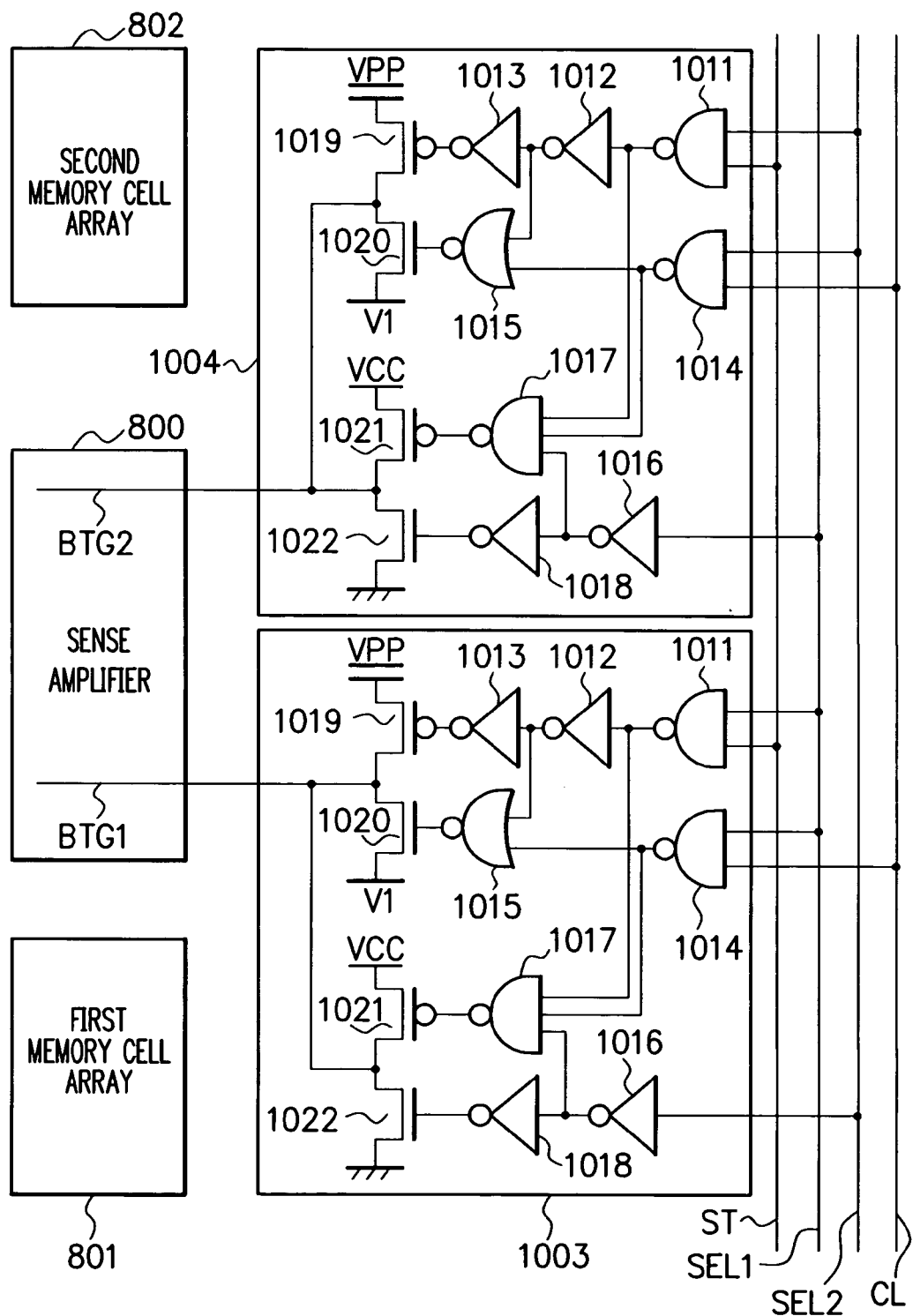

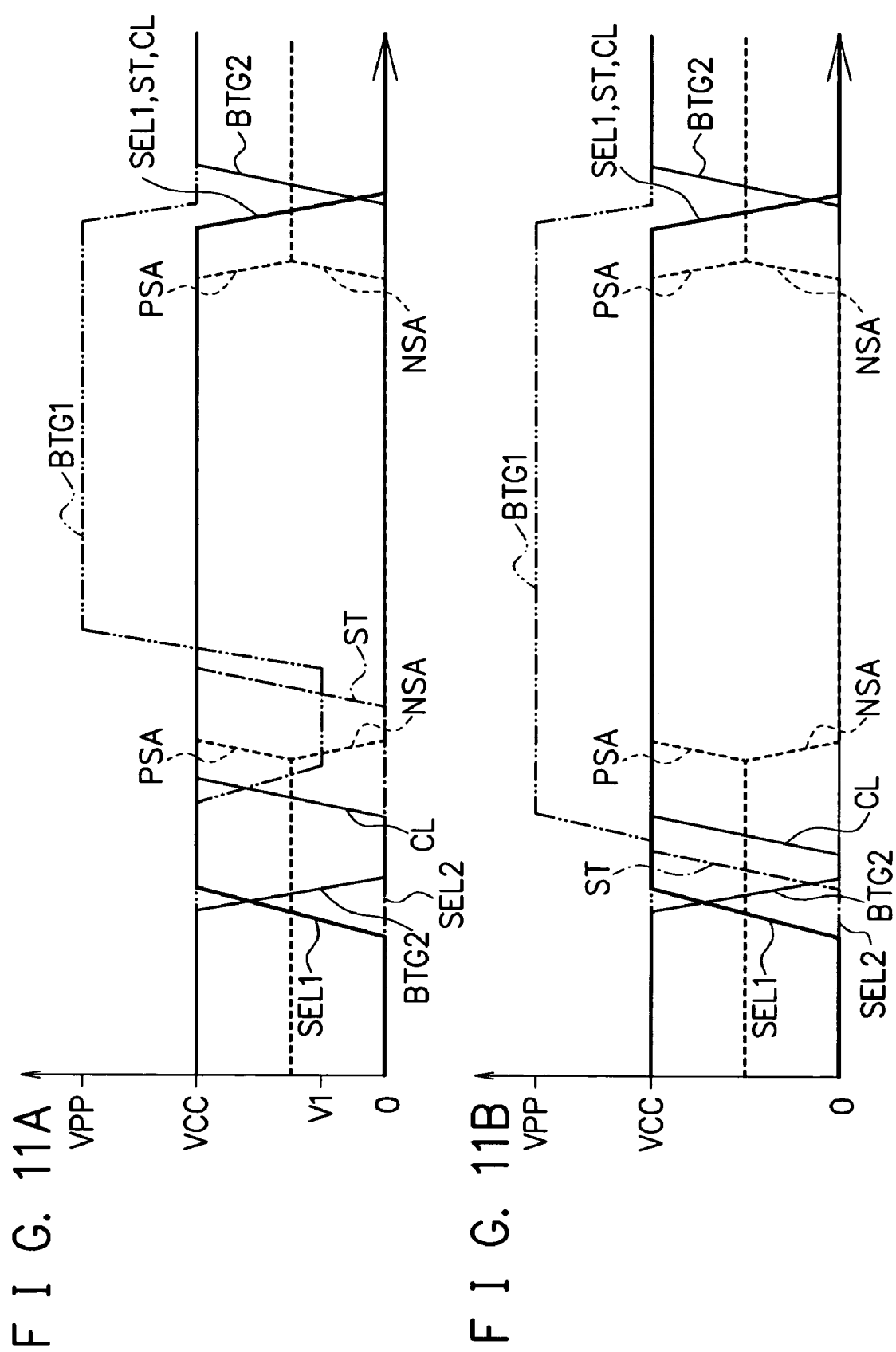

SEMICONDUCTOR STORAGE DEVICE

CROSS-REFERENCE TO RELATED APPLICATIONS

This nonprovisional application is a continuation application of and claims the benefit of International Application No. PCT/JP03/05932, filed May 13, 2003. The disclosure of the prior application is hereby incorporated herein in its entirety by reference.

TECHNICAL FIELD

The present invention relates to a semiconductor storage device, and in particular to a semiconductor storage device having memory cells and sense amplifiers.

BACKGROUND ART

DRAM (dynamic random access memory) is a RAM in need of refreshing, and is a memory which stores data based on presence or absence of electric charge on capacitors. Data stored in DRAM expires with the elapse of time due to leakage current from the capacitors. It is therefore necessary to read out the data at predetermined time intervals, and to write (restore) them again. This is referred to as refreshing. DARM can be realized with a memory cell area smaller than that of SRAM (static random access memory), and thereby can be obtained as a large-capacity, economic memory.

SRAM is a RAM in no need of refreshing, of which memory cell being composed of a flipflop, and information once written therein will never be lost until a power source is disconnected. SRAM is simple to use and is ready to attain high-speed performance, because only a simple operational timing control is necessary, without needing refreshing.

Pseudo SRAM has memory cells based on a DRAM structure, and has, incorporated therein, a refresh circuit for automatic refreshing. Unlike DRAM, the control thereof is simple, because there is no need of externally controlling the refreshing. External interface of which is similar to that of SRAM.

It is not possible to know timing of the refreshing of SRAM from the external, because SRAM is internally refreshed in an automatic manner. During the refreshing, data cannot be read out from the memory cells. This results in an operation such that, if a read command is entered from the external during the refreshing, the reading can start only after the refreshing comes to the end. Access time (time required before data output) during the reading therefore amounts as much as a sum of the refreshing time and reading time for the worst case. It is therefore an important factor to shorten the refreshing time in view of shortening the access time.

SUMMARY OF THE INVENTION

An object of the present invention is to provide a semiconductor storage device allowing rapid access.

According to one aspect of the present invention, there is provided a semiconductor storage device which comprises a memory cell storing data; bit lines connected to the memory cell, allowing therethrough data input or output to or from the memory cell; a sense amplifier connected to the bit line, amplifying data on the bit line; and a switching transistor connecting or disconnecting the bit line connected to the memory cells to or from the bit line connected to the sense amplifier. The switching transistor operates differently in a first memory cell access operation and in a second memory cell access operation.

By making difference in the operations of the switching transistor between the first and second memory cell access operations, speeds of the first and second memory cell access operations are increased as compared with those for the case where the operations of the switching transistor are set same. This makes it possible to generally increase the access speed of the semiconductor storage device. For example, making difference in the operations of the switching transistor between the reading and refreshing is successful in raising the refreshing speed.

BRIEF DESCRIPTION OF THE DRAWINGS

FIG. 2 is a drawing showing an exemplary internal configuration of a command decoder;

FIG. 10 is a drawing showing an exemplary circuit generating a signal of a gate line of a transistor in a sense amplifier circuit; and FIG. 11A is a timing chart showing exemplary reading and writing, and FIG. 11B is a timing chart showing an exemplary refreshing.

DETAILED DESCRIPTION OF THE PREFERRED EMBODIMENTS

Figure 1:
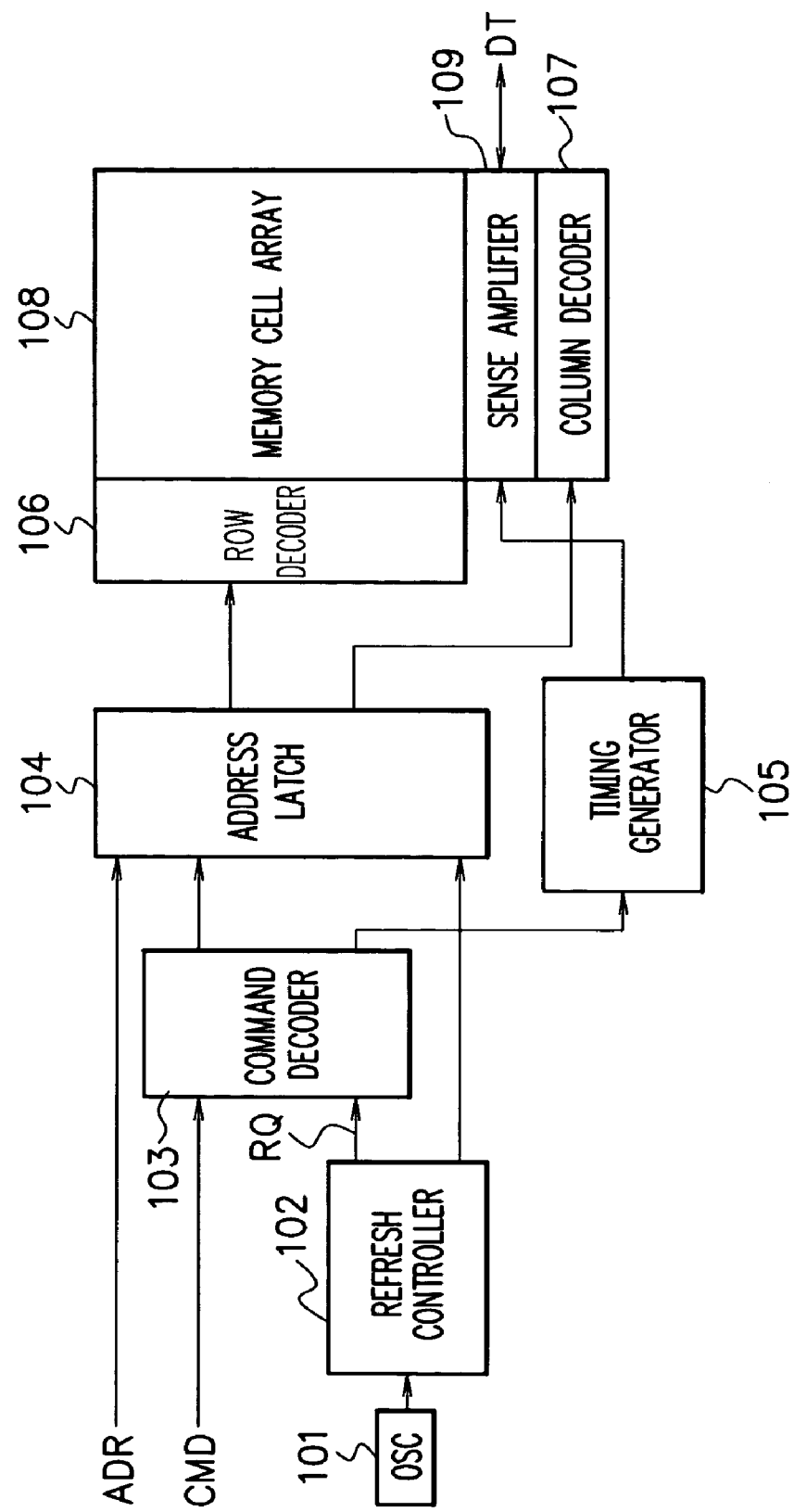
FIG. 1 is a block diagram showing an exemplary configuration of a semiconductor storage device according to an embodiment of the present invention.

FIG. 1 shows an exemplary configuration of a semiconductor storage device according to an embodiment of the present invention. The semiconductor storage device is a pseudo SRAM (static random access memory). Pseudo SRAM has a memory cell based on a DRAM structure, and has, incorporated therein, a refresh circuit which refreshes the memory cell in an automatic and periodical manner.

The device allows external input of address ADR and command CMD, and input/output of data DT. For example in the reading, if a read command is entered as the command CMD and a read address is entered as the address ADR, data is read out from the memory cell array 108, and is output as the data DT. In the writing, if a write command is entered as the command CMD, a write address is entered as the address ADR, a write data is entered as the data DT, and data is written into the memory cell array 108.

A command decoder 103 decodes the command CMD, and outputs a control signal to an address latch 104 and a timing generator 105. The address latch 104 latches the address ADR depending on the control signal, outputs a row address to a row decoder 106, and outputs a column address to a column decoder 107. The row decoder 106 decodes the row address, and the column decoder 107 decodes the column address. The memory cell array 108 has a large number of memory cells in a two-dimensional arrangement. Each memory cell can store data. Decoding of the row decoder 106 and the column decoder 107 result in selection of 16-bit memory cells, for example.

The timing generator 105 generates a timing signal depending on the input control signal, and outputs it to a sense amplifier circuit 109. The sense amplifier circuit 109 reads out data from a selected memory cell, amplifies them, and outputs them as the data DT. The sense amplifier circuit 109 also writes the data thus input as the data DT into the selected memory cell.

The refresh controller 102 periodically outputs, based on an oscillation signal generated by an oscillator 101, a refresh command RQ to the command decoder 103, and outputs a refresh address to the address latch 104. This makes the sense amplifier circuit 109 amplify the data in the selected memory cell, and restore (write back) them in the memory cell.

The refreshing internally proceeds in an automatic manner. During the refreshing, the reading and the writing are disabled. If the read command or the write command is entered during the refreshing, the reading or the writing is enabled only after the refreshing comes to the end. On the other hand, the refreshing cannot be executed during the reading/writing. The refreshing is enabled only after the reading/writing comes to the end. These controls are executed by the command decoder 103. The details will be explained below.

FIG. 2 shows an exemplary internal configuration of the command decoder 103. A command decoder 201 decodes the read/write command CMD, and outputs it to a latch 205. The latch 205 latches the read/write command, and outputs it to an AND circuit 206 and a comparator 204. A latch 202 latches the refresh command RQ, and outputs it to the comparator 204 and an AND circuit 208. The AND circuit 208 outputs a refresh command CMD2. A refresh time measurement circuit 203 receives an input of the refresh command CMD2, and resets the latch 202 when a predetermined time period elapsed after execution of the refresh command RQ. The comparator 204 outputs a low-level signal when the read/write command is input prior to the refresh command, and outputs a high-level signal in other cases. The AND circuit 206 receives the output signal of the latch 205 and the output signal of the comparator 204, and outputs an ANDed signal as a read/write command CMD1. More specifically, the AND circuit 206 does not output the read/write command held in the latch 205 when the refreshing proceeds, but outputs the read/write command CMD1 in the latch 205 when the refreshing does not proceed.

An inverter 207 logically inverts the output signal of the comparator 204 and outputs it. The AND circuit 208 receives the output signal of the inverter 207 and the output signal of the latch 202, and outputs an ANDed signal as the refresh command CMD2. More specifically, the AND circuit 208 does not output the refresh command if the reading/writing is running, and outputs the refresh command CMD2 in the latch 202 if the reading/writing is not running.

If the read/write command is input during the refreshing, the AND circuit 206 does not output the read/write command. When the refreshing comes to the end, the refresh time measurement circuit 203 resets the latch 202. The comparator 204 then outputs a high-level signal, and the AND circuit 206 outputs the read/write command held in the latch 205. The read/write time measurement circuit 209 receives an input of the read/write command CMD1, executes read/write, and then resets the latch 205.

If the refresh command is input during the reading/writing, the AND circuit 208 does not output the refresh command. When the reading/writing comes to the end, the read/write time measurement circuit 209 resets the latch 205. The comparator 204 then outputs a low-level signal, and the AND circuit 208 outputs the refresh command CMD2 held in the latch 202. The latch 202 is then reset after completion of the refreshing.

Figure 3:
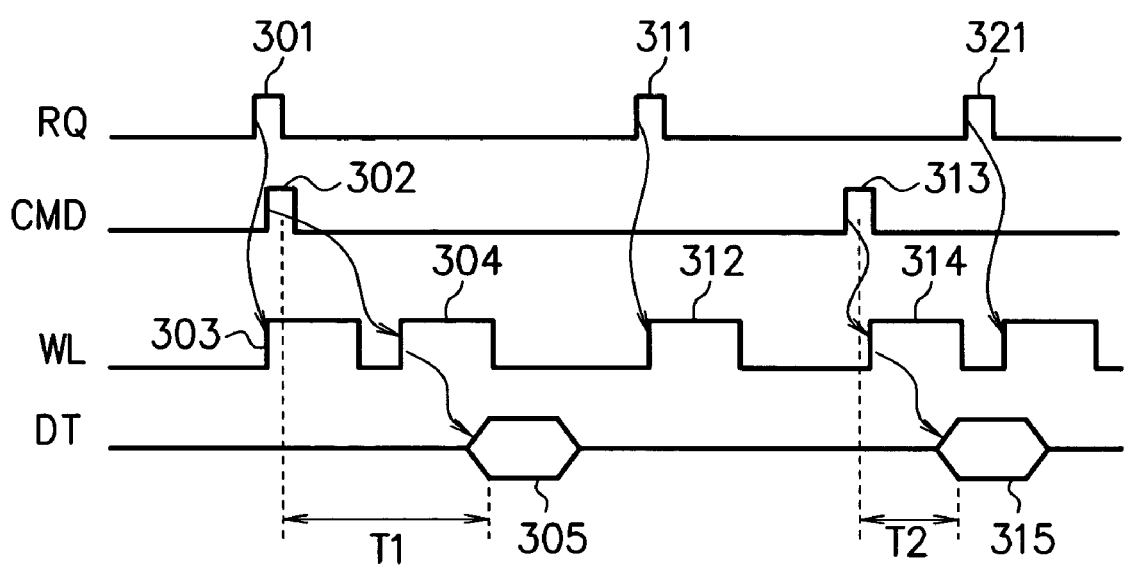
FIG. 3 is a timing chart showing refreshing and reading.

FIG. 3 is a timing chart showing the refreshing and reading. As for the refresh command RQ, commands 301, 311 and 321 are internally generated in a periodical manner. Upon generation of the refresh command 301, a word line WL (see FIG. 5) is brought up to a high level 303 so as to allow the refreshing to proceed. When the refresh command 311 generates after the elapse of a predetermined period of time, the word line WL is brought up to a high level 312 so as to allow the refreshing to proceed.

As for the external command CMD, read commands 302 and 313 are externally input at an arbitrary timing. Because the read command 313 is input when the refreshing is not run, the word line WL is brought up to the high level immediately after the read command 313, the reading is activated, and a read data 315 is output as the data DT. Time T2 is a duration of time ranging from input of the read command 313 to output of the data 315, and corresponds to the reading time.

In contrast to this, because the read command 302 is input during the refreshing triggered by the refresh command 301, the reading is activated after completion of the refreshing. More specifically, when the refresh command 301 is generated, the word line WL is brought up to the high level 303, and the refreshing is carried out. If the read command 302 is input during the refreshing, the word line WL is brought up to the high level 304 after completion of the refreshing, the reading is carried out, and the read data 305 is output as the data DT. The time T1 is a read time ranging from input of the read command 302 to output of the data 305, and corresponds to a total time of the refreshing time and reading time.

Figure 4:
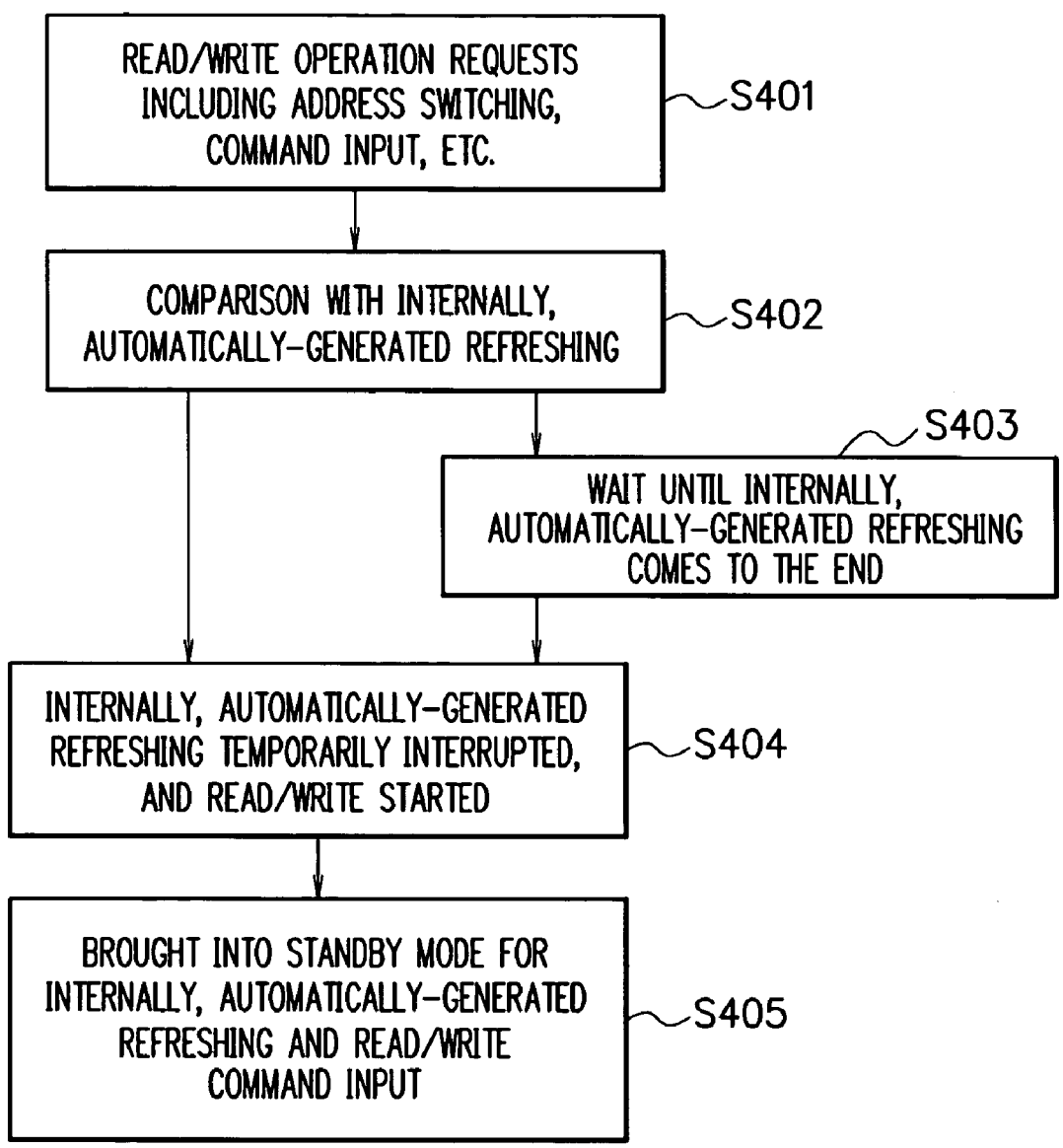
FIG. 4 is a flow chart showing a basic operation of an SRAM.

FIG. 4 is a flow chart showing a basic operation of a pseudo SRAM. In step S401, an address ADR is switched, the command CMD and so forth are input, to thereby request the reading/writing. Next in step S402, the read/write request is compared with the internally, automatically-generated refreshing. The process advances to step S403 if it occurs during the refreshing, and advances to step S404 if it does not occur during the refreshing. In step S403, the process is halted until the internally, automatically-generated refreshing comes to the end. Thereafter, the process advances to step S404. In step S404, the internally, automatically-generated refreshing is temporarily interrupted, and the reading/writing is started. Next in step S405, after completion of the reading/writing, the internally, automatically-generated refreshing is restarted, and the process is brought up to a standby mode for the read/write command input.

Figure 5:
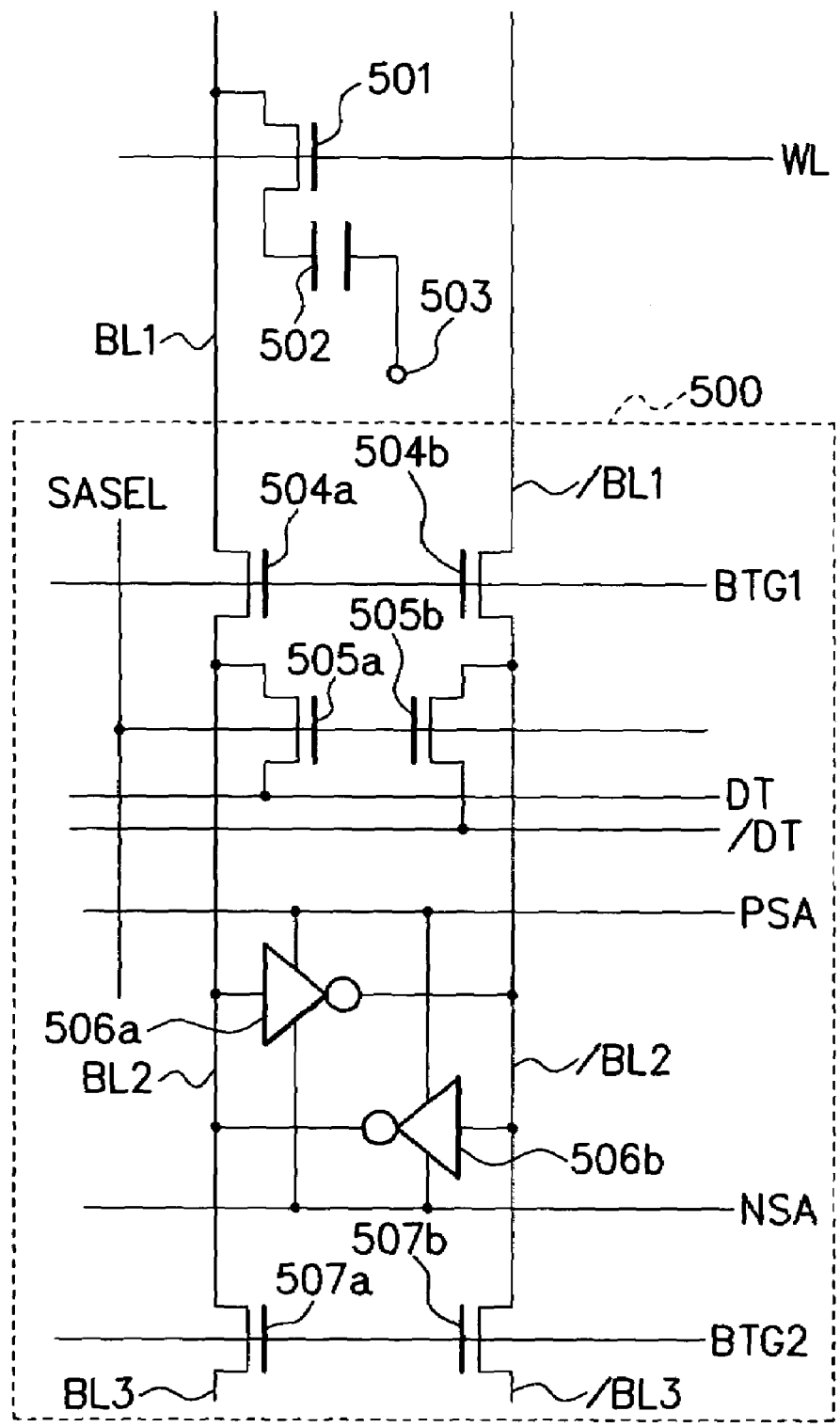
FIG. 5 is a circuit diagram showing an exemplary configuration of a sense amplifier circuit and a memory cell.

FIG. 5 shows an exemplary configuration of the sense amplifier circuit 109 shown in FIG. 1 and a memory cell. The sense amplifier circuit 500 corresponds to the sense amplifier circuit 109 shown in FIG. 1. An n-channel MOS transistor 501 and a capacitor 502 correspond to one memory cell in the memory cell array 108 shown in FIG. 1. The n-channel MOS transistor 501 has a gate connected to the word line WL, and has the drain connected to a bit line BL1. The capacitor 502 is connected between the source of the transistor 501 and a terminal 503. The terminal 503 is supplied with a memory cell plate potential. When the word line WL is brought up to high level, the transistor 501 turns on, and the memory cell is selected. This results in connection of the bit line BL1 to the capacitor 502.

Next paragraphs will describe a configuration of the sense amplifier circuit 500. The sense amplifiers 506a and 506b are inverters, capable of outputting amplified signals obtained by logically inverting input signals. Drive signal lines PSA and NSA are connected to the sense amplifiers 506a and 506b. The sense amplifiers 506a and 506b have a p-channel MOS transistor and an n-channel MOS transistor. The drive signal line PSA is connected to the source of the p-channel MOS transistor. The drive signal line NSA is connected to the source of the n-channel MOS transistor. When both of the drive signal lines PSA and NSA have an intermediate potential, the sense amplifiers 506a and 506b are not activated. In contrast to this, when the drive signal line PSA reaches the source potential, and the drive signal line NSA falls to the ground potential, the sense amplifiers 506a and 506b are activated and brought up to operation state. The sense amplifier 506a has an input terminal connected to the bit line BL2, and an output terminal connected to a bit line /BL2. The sense amplifier 506b has an input terminal connected to the bit line /BL2, and an output terminal connected to the bit line BL2. A pair of the bit line BL2 and /BL2 are supplied with signals logically inverted from each other.

An n-channel MOS transistor 505a has the gate connected to a selected signal line SASEL, the source connected to a data bus DT, and the drain connected to the bit line BL2. An n-channel MOS transistor 505b has the gate connected to a selected signal line SASEL, the source connected to a data bus /DT, and the drain connected to a bit line /BL2. The pair of the data buses DT and /DT are those for signals logically inverted from each other, through which read data is output to the external, and write data is input from the external.

An n-channel MOS transistor 504a has the gate connected to a gate line BTG1, and the source and drain connected to the bit lines BL1 and BL2. The n-channel MOS transistor 504b has the gate connected to the gate line BTG1, and the source and drain connected to the bit lines /BL1 and /BL2.

An n-channel MOS transistor 507a has the gate connected to the gate line BTG2, and the source and drain connected to the bit line BL2 and a bit line BL3. An n-channel MOS transistor 507b has the gate connected to the gate line BTG2, and the source and drain connected to the bit line /BL2 and a bit line /BL3.

A plurality of memory cells are connected to the bit lines BL1 and /BL1. A plurality of memory cells are connected also to the bit lines BL3 and /BL3. When a memory cell connected to the bit line BL1 or /BL1 is selected, the transistors 504a, 504b turn on, and the transistors 507a, 507b turn off. As a consequence, data on the bit line BL1 or /BL1, read out from the memory cell connected to the bit line BL1 or /BL1, is amplified by the sense amplifiers 506a, 506b.

On the contrary, when a memory cell connected to the bit line BL3 or /BL3 is selected, the transistors 507a, 507b turn on, and the transistors 504a, 504b turn off. As a consequence, data on the bit line BL3 or /BL3, read out from the memory cell connected to the bit line BL3 or /BL3, is amplified by the sense amplifiers 506a, 506b.

Figure 6:
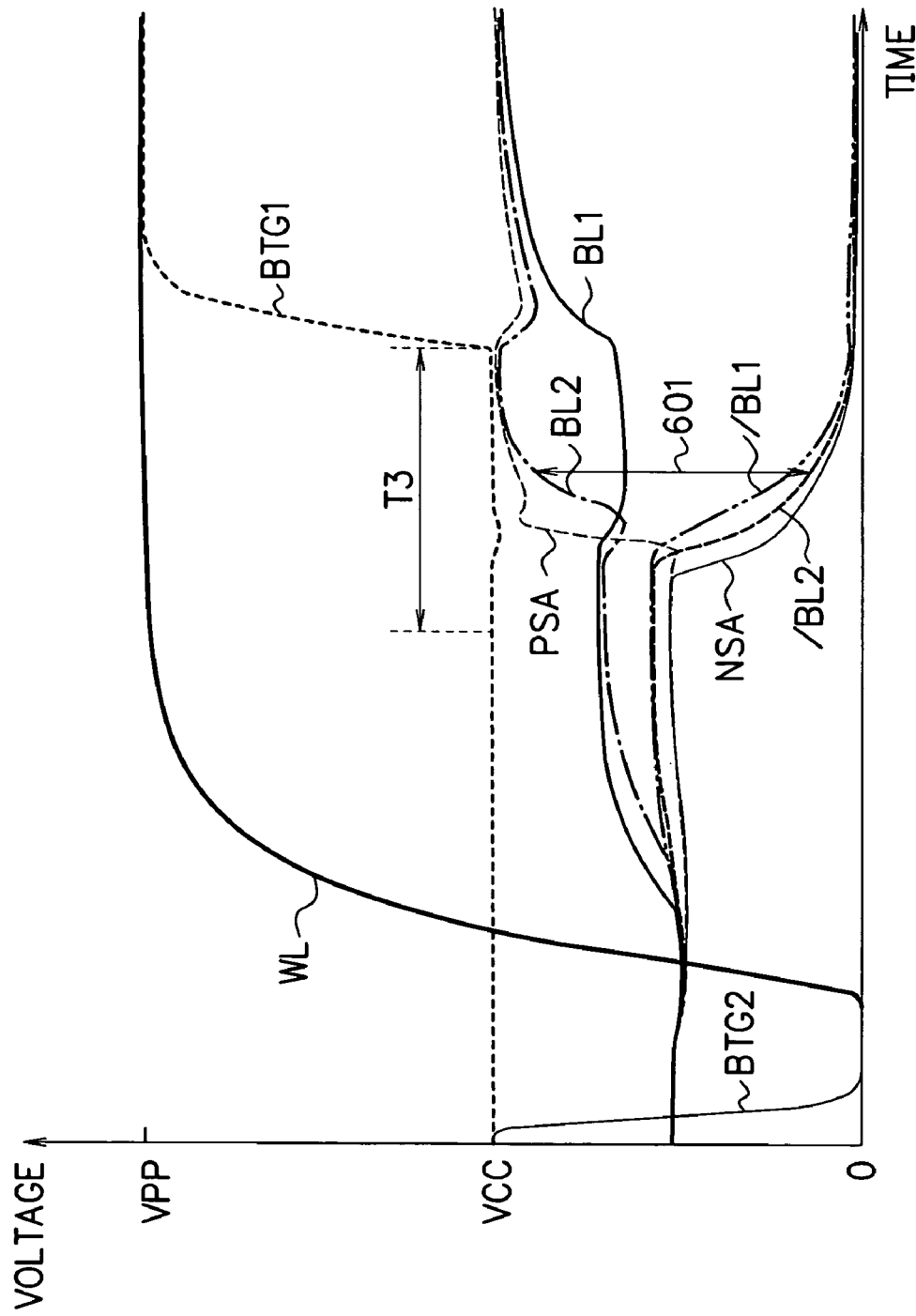
FIG. 6 is a timing chart showing an exemplary reading of a pseudo SRAM.

FIG. 6 is a timing chart showing an exemplary reading of a pseudo SRAM. In the initial stage, the gate lines BTG1 and BTG2 have the source potential VCC. The transistors 504a, 504b, 507a and 507b turn on, the bit lines BL1, BL2 and BL3 are connected, and the bit lines /BL1, /BL2 and /BL3 are connected. The drive signal lines PSA and NSA have an intermediate potential between the source potential VCC and ground potential, and the sense amplifiers 506a, 506b are in their inactivated states. The bit lines BL1, /BL1, BL2 and /BL2 are precharged at the intermediate potential. The word line WL has the ground potential, and the transistor 501 is in its off state.

First, upon input of the read command, the bit line BTG2 is brought from the source potential VCC down to the ground potential, and the transistors 507a, 507b turn off. Next, when the word line WL is brought up to a high potential VPP, the transistor 501 turns on, and voltage of the capacitor 502 is transmitted to the bit line BL1. The high potential VPP is a potential higher than the source potential VCC. The memory cell can store data depending on whether the capacitor 502 accumulates electric charge or not. Supposing now, for example, that electric charge is accumulated in the capacitor 502, the bit lines BL1 and BL2 raise their potential values.

Next, the source potential VCC is supplied to the drive signal line PSA, and the ground potential is supplied to drive signal line NSA, to thereby activate the sense amplifiers 506a, 506b. The sense amplifier 506a logically inverts and amplifies data on the bit line BL2, and outputs it to the bit line /BL2. The sense amplifier 506b logically inverts and amplifies data on the bit line /BL2, and outputs it to the bit line BL2. As a consequence, the bit line BL2 is raised close to the source potential VCC, and the bit line /BL2 is lowered close to the ground potential. The bit line BL1 is limited to a potential lower by the transistor threshold voltage Vth than the potential of the gate line BTG1, due to influence of the transistor 504a.

After a predetermined potential difference 601 is attained between the bit lines BL2 and /BL2, the selected signal line SASEL is brought up to a high level, to thereby turn the transistors 505a, 505b on. Potential values of the bit lines BL2 and /BL2 are then output to the data buses DT and /DT, and this makes it possible to output the read data to the external.

Next, in order to restore the data into the memory cell, the gate line BTG1 is raised up to a high potential VPP. The bit line BL1 then raises close to the source potential VCC, and the source potential VCC is charged in the capacitor 502. This makes it possible to restore the data on the bit line BL1 into the capacitor 502.

Figure 7:
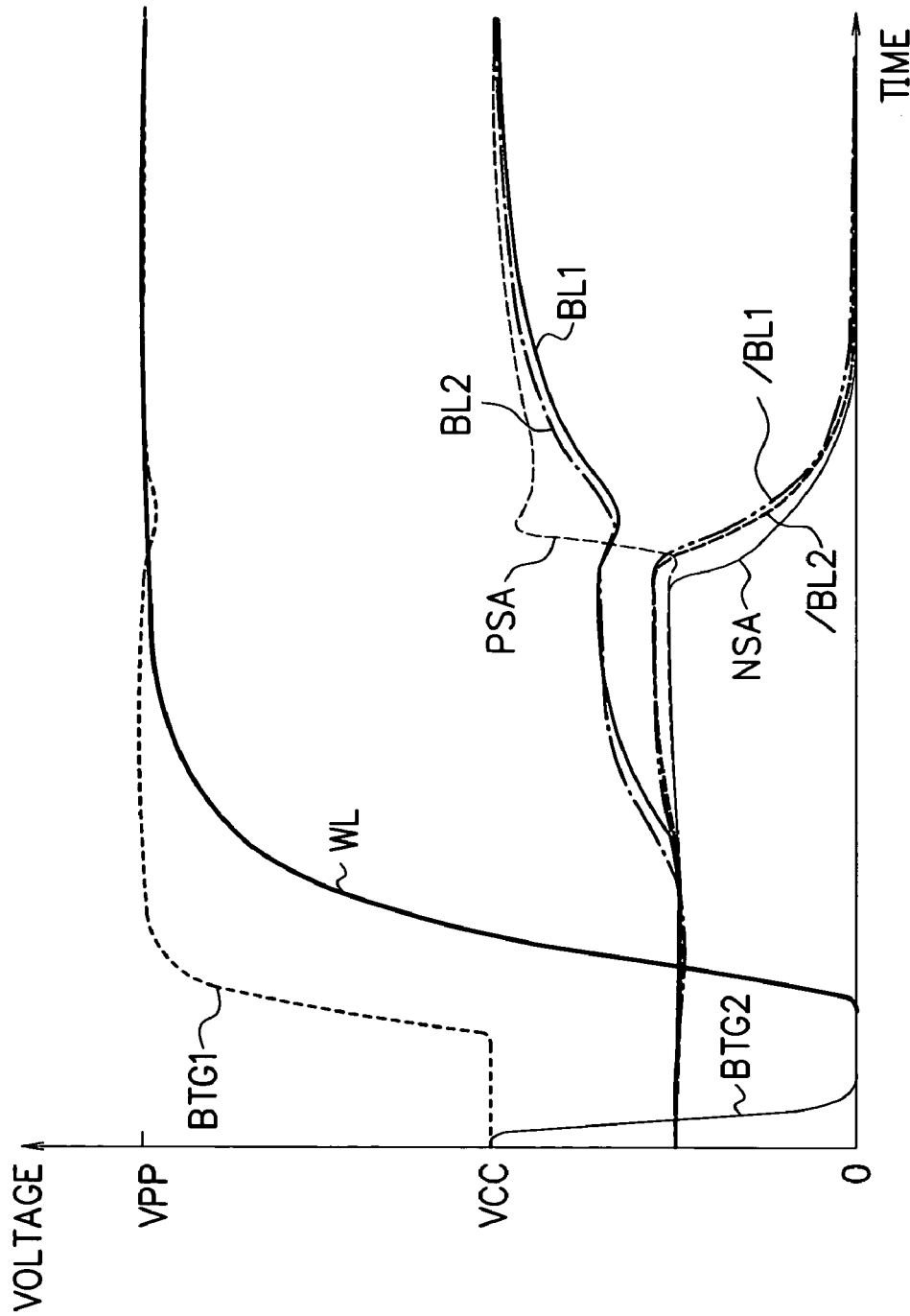
FIG. 7 is a timing chart showing an exemplary refreshing operation of a pseudo SRAM.

FIG. 7 is a timing chart showing an exemplary refreshing of a pseudo SRAM. The refreshing differs from the reading shown in FIG. 6, only in the signal control timing of the gate line BTG1. The initial signal state is same as that shown in FIG. 6. After the bit line BTG2 is brought down to the ground potential, and before the word line WL is raised up to the potential VPP, the gate line BTG1 is raised from the source potential VCC up to the high potential VPP. In any other aspects, the control methods for the refreshing and reading are the same. Similarly to the reading, the refreshing reads the data out from the capacitor 502 in the memory cell, amplifies, and restores it into the capacitor 502.

In the reading shown in FIG. 6, the source potential VCC and ground potential are supplied to the drive signal lines PSA and NSA, respectively, to thereby activate the sense amplifiers 506a, 506b, and the bit line BL1 is limited to a potential lower by the transistor threshold voltage Vth than the source potential VCC due to influence of the transistor 504a. Succeeding supply of a high potential VPP to the gate line BTG1 raises the bit line BL1 close to the source potential VCC. Because of this sort of processes, the read time takes a relatively long period.

In contrast to this, in the refreshing shown in FIG. 7, the high potential VPP is preliminarily supplied to the bit line BTG1 before the high potential VPP is supplied to the word line WL. When the source potential VCC and ground potential are supplied to the drive signal line PSA and NSA, respectively, to thereby activate the sense amplifiers 506a, 506b, the bit line BL1 immediately rises close to the source potential VCC together with the bit line, without being limited in the potential rise. This allows the refreshing to complete within a period shorter than that of the reading (FIG. 6). More specifically, the refreshing demands only a shorter time period for raising the bit line BL1 close to the source potential VCC, as compared with the reading. With completion of the restoration, the reading and refreshing come to the end.

In the reading shown in FIG. 6, there is adopted the confined sensing system in which the gate line BTG1 is adjusted to the source potential VCC during operation of the sense amplifiers 506a, 506b. Because the gate line BTG1 is adjusted to the source potential VCC rather than to the high potential VPP, the transistors 504a, 504b cannot turn on completely, and thereby the bit line BL2 is not completely connected to the bit line BL1. This reduces the capacitance of the bit line BL2, makes it possible for the sense amplifiers 506a, 506b to perform a high-speed amplification, and makes it possible to rapidly raise the potential of the bit line BL2.

A general method may be such as carrying out both of the reading and refreshing under the control shown in FIG. 6. In contrast to this, the refreshing period can be shortened by adopting the control shown in FIG. 6 for the reading, and by adopting the control shown in FIG. 7 for the refreshing. As a consequence, the refreshing completes within a short period even when the timings of the read command 302 and refresh command 301 overlap, and the read time T1 can be shortened.

Figure 8:
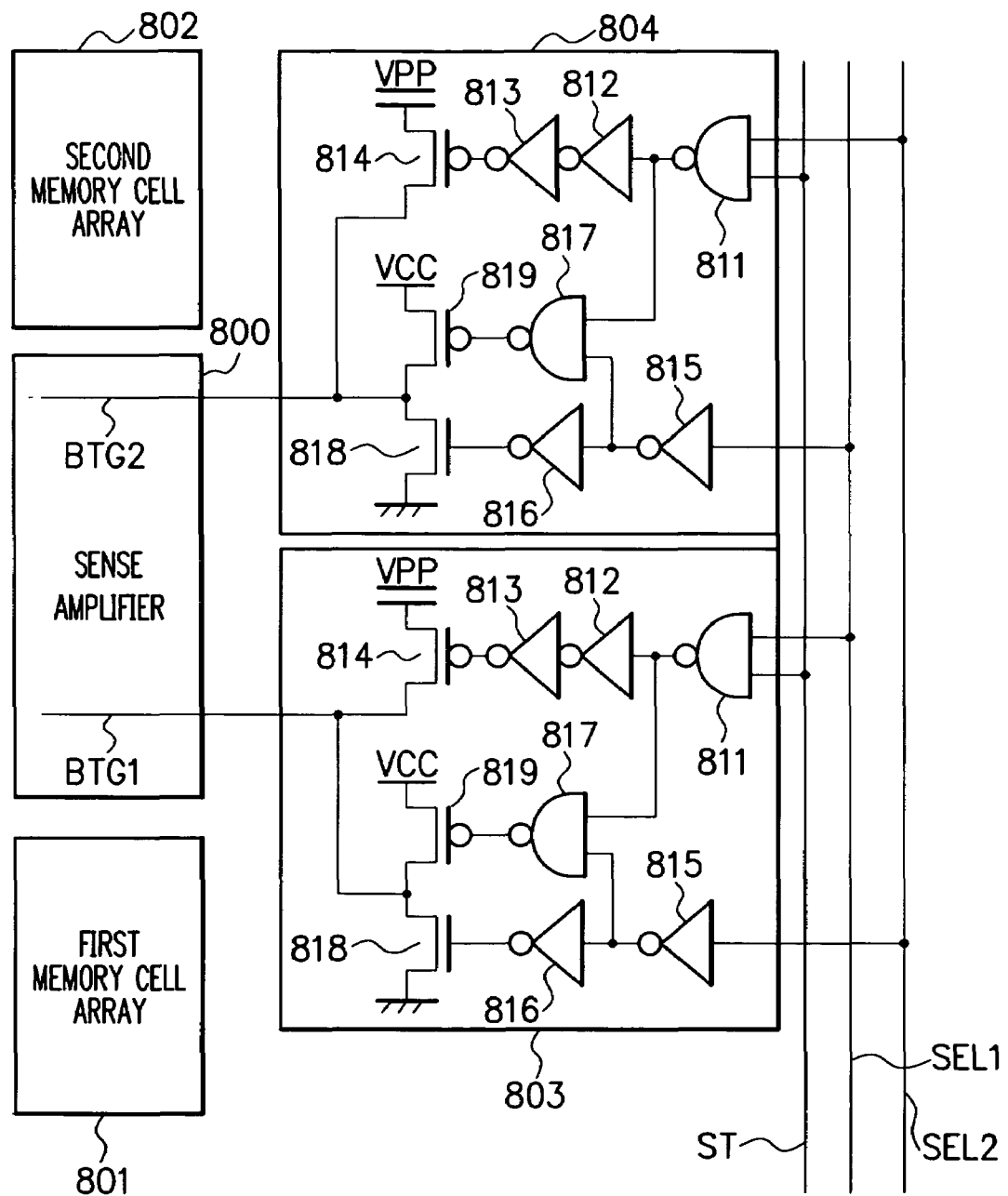
FIG. 8 is a drawing showing an exemplary circuit generating a signal of a gate line of a transistor in a sense amplifier circuit.

FIG. 8 shows an exemplary circuit generating signals of the gate line BTG1 and BTG2. The sense amplifier circuit 800 corresponds to the sense amplifier circuit 500 shown in FIG. 1. The first memory cell array 801 is a memory cell array connected to the bit line BL1 shown in FIG. 5. The second memory cell array 802 is a memory cell array connected to the bit line BL3 shown in FIG. 5. The first and second memory cell arrays 801 and 802 is alternatively selected. The selected signal line SEL1 is a signal line selecting the first memory cell array 801. The selected signal line SEL2 is a signal line selecting the second memory cell array 802. An exemplary case, where the first memory cell array 801 is selected as described in the above, will be explained. In this case, the selected signal line SEL1 is raised up to the source potential VCC, and the selected signal line SEL2 remains at the ground potential. The sense amplifier circuit 800 is commonly used by the first memory cell array 801 and 802. Restore start signal line ST is a signal line starting the restoration.

A circuit 803 is a circuit generating a signal of the gate line BTG1. A NAND circuit 811 has two input terminals connected to the selected signal line SEL1 and restore start signal line ST, calculate a NAND, and outputs a result via inverters 812 and 813 to the gate of a p-channel MOS transistor 814. The transistor 814 has the source connected to the high potential VPP, and the drain connected to the gate line BTG1. The selected signal line SEL2 is connected through inverters 815 and 816 to the gate of an n-channel MOS transistor 818. The transistor 818 has the source connected to the ground potential, and the drain connected to the gate line BTG1. A NAND circuit 817 receives an output signal of the NAND circuit 811 and an output signal of the inverter 815, calculates a NAND, and outputs a result to the gate of a p-channel MOS transistor 819. The transistor 819 has the source connected to the source potential VCC, and the drain connected to the gate line BTG1.

The above-mentioned inverters logically invert the input signal and output it. The inverter 813 has a level shifter so as to allow the transistor 814 to transmit the high potential VPP to the gate line BTG1. More specifically, the inverter 813 can supply potential higher than the high potential VPP to the gate of the transistor 814.

A circuit 804 is a circuit generating a signal of the gate line BTG2, a basic configuration of which is same as that of the circuit 803. Different points will be explained in the next. The NAND circuit 811 has two input terminals connected to the selected signal line SEL2 and restore start signal line ST. The inverter 815 has the input terminal connected to the selected signal line SEL1. A mutual connection point of the drains of the transistor 814, transistor 819 and transistor 818 is connected to the gate line BTG2.

Figure 9A:
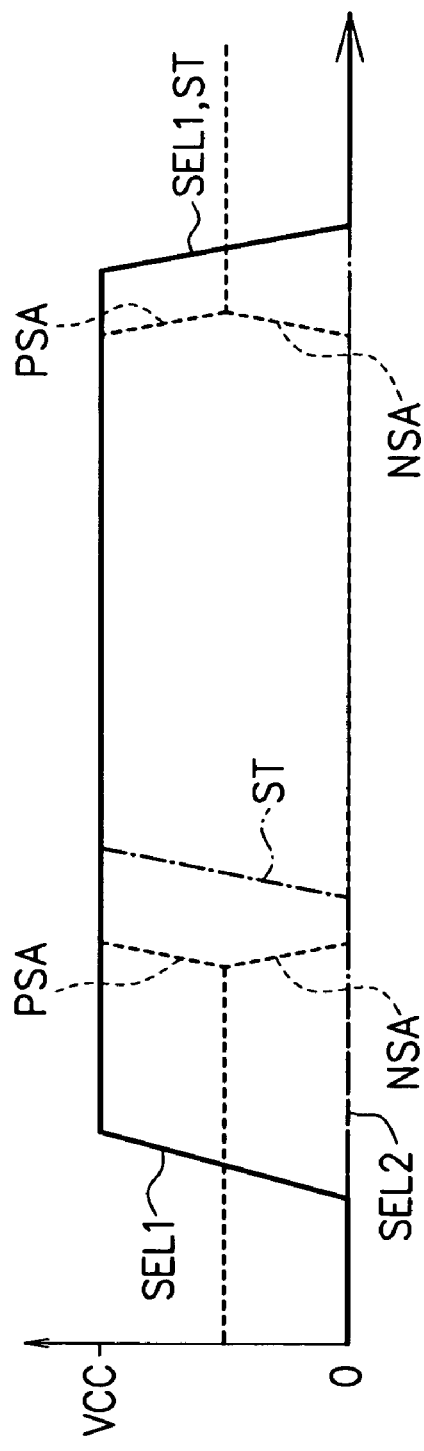
FIG. 9A is a timing chart showing exemplary reading and writing.

FIG. 9A is a timing chart of exemplary reading and writing. First, in order to select the first memory cell array 801, the source potential VCC is supplied to the selected signal line SEL1, and the ground potential is supplied to the selected signal line SEL2. Next, the source potential VCC is supplied to the drive signal line PSA, and the ground potential is supplied to the drive signal line NSA. Next, the restore start signal line ST is raised from the ground potential up to the source potential VCC. The gate line BTG1 then rises from the source potential VCC up to the high potential VPP. Next, the drive signals PSA and NSA are brought to an intermediate potential. Then the restore start signal line ST is brought down to the ground potential, and the selected signal line SEL1 is brought down to the ground potential. In the writing, it is all enough to supply the source potential VCC and ground potential to the drive signal line PSA and NSA, respectively, and to externally input the write data to the data bus DT, /DT shown in FIG. 5 to thereby raise the selected signal ST up to the high level, before the source potential VCC is supplied to the restore start signal line ST.

Figure 9B:
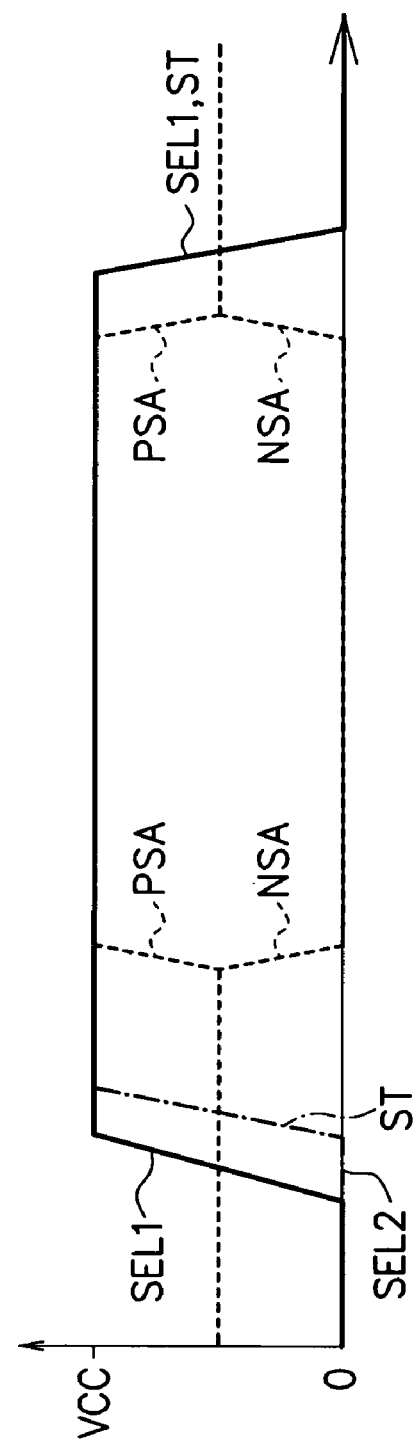
FIG. 9B is a timing chart showing an exemplary refreshing.

FIG. 9B is a timing chart of an exemplary refreshing. The refreshing is basically same with the operation shown in FIG. 9A, but differs in the signal control timing for the restore start signal line ST. In the refreshing shown in FIG. 9B, after the source potential VCC is supplied to the selected signal line SEL1, and before the source potential VCC and ground potential are supplied to the drive signal line PSA and NSA, respectively, the source potential VCC is supplied to the restore start signal line ST. When the source potential VCC is supplied to the restore start signal line ST, the gate line BTG1 is brought up to the high potential VPP.

It is also allowable, in the reading shown in FIG. 6, to adjust the gate line BTG1 in period T3 to potential V1 (see FIG. 11A), which is lower than the source potential VCC, to thereby further enhance effects of the confined sensing. The potential V1 is typically a an intermediate potential between the source potential VCC and ground potential, but may be the ground potential or a potential lower than the ground potential.

By adjusting the gate line BTG1 to the intermediate potential V1 during the confinement period T3, the transistors 504a, 504b cannot turn on completely, and thereby the bit line BL2 is not completely connected to the bit line BL1. This further reduces the capacitance of the bit line BL2, makes it possible for the sense amplifiers 506a, 506b to perform a high-speed amplification, and makes it possible to rapidly raise the potential of the bit line BL2.

FIG. 10 shows an exemplary circuit adjusting the bit line BTG1 to the intermediate potential V1. The circuit shown in FIG. 10 is such as having circuits 1003 and 1004, which are the replacements of the circuits 803 and 804 shown in FIG. 8, being added with a confinement signal line CL, and being same with those shown in FIG. 8 in other aspects.

The circuit 1003 is a circuit generating a signal for the gate line BTG1. A NAND circuit 1011 has two input terminals connected to the selected signal line SEL1 and restore start signal line ST, calculates a NAND, and outputs a result through the inverters 1012 and 1013 to the gate of a p-channel MOS transistor 1019. The transistor 1019 has the source connected to the high potential VPP, and the drain connected to the gate line BTG1. NAND circuit 1014 has two input terminals connected to the selected signal line SEL1 and confinement signal line CL, calculates a NAND, and outputs a result. A NOR circuit 1015 receives an output signal of the inverter 1012 and an output signal of the NAND circuit 1014, calculates a NOR, and outputs a result to the gate of an n-channel MOS transistor 1020. The transistor 1020 has the source connected to the intermediate potential V1, and the drain connected to the gate line BTG1.

The selected signal line SEL2 is connected through the inverters 1016 and 1018 to the gate of an n-channel MOS transistor 1022. The transistor 1022 has the source connected to the ground potential, and the drain connected to the gate line BTG1. The NAND circuit 1017 receives an output of the NAND circuit 1011, an output of the NAND circuit 1014, and an output of the inverter 1016, calculates a NAND, and outputs a result to the gate of a p-channel MOS transistor 1021. The transistor 1021 has the source connected to the source potential VCC, and the drain connected to the gate line BTG1.

The circuit 1004 is a circuit generating a signal of the gate line BTG2, a basic configuration of which is same as that of the circuit 1003. Different points will be explained in the next. The NAND circuit 1011 has two input terminals connected to the selected signal line SEL2 and restore start signal line ST. The NAND circuit 1014 has two input terminals connected to the selected signal line SEL2 and confinement signal line CL. The inverter 1016 has the input terminal connected to the selected signal line SEL1. A mutual connection point of the drains of the transistors 1019, 1020, 1021, 1022 is connected to the gate line BTG2.

FIG. 11A is a timing chart of exemplary reading and writing. First, in order to select the first memory cell array 801, the source potential VCC is supplied to the selected signal line SEL1, and the ground potential is supplied to the selected signal line SEL2. The gate line BTG2 then falls from the source potential VCC down to the ground potential. Next, the confinement signal line CL is raised from the ground potential up to the source potential VCC. The gate line BTG1 falls from the source potential VCC down to the intermediate potential V1. Next, the source potential VCC is supplied to the drive signal line PSA, and the ground potential is supplied to the drive signal line NSA. Next, the restore start signal line ST is raised from the ground potential up to the source potential VCC. The gate line BTG1 is then raised from the intermediate potential V1 up to the high potential VPP. Next, the drive signal PSA and NSA are brought to the intermediate potential. Next, the selected signal line SEL1, restore start signal line ST and confinement signal line CL are brought down to the ground potential. The gate line BTG1 then falls down to the source potential VCC, and the gate line BTG2 rises up to the source potential VCC. The adjustment of the gate line BTG1 to the intermediate potential V1 described in the above allows rapid reading and writing.

FIG. 11B is a timing chart of an exemplary refreshing. The refreshing is basically same with the operation shown in FIG. 11A, but differs in the signal control timing for the restore start signal line ST. In the refreshing shown in FIG. 11B, after the source potential VCC is supplied to the selected signal line SEL1, and before the source potential VCC is supplied to the confinement signal line CL, the source voltage VCC is supplied to the restore start signal line ST. When the source potential VCC is supplied to the restore start signal line ST, the gate line BTG1 is brought from the source potential VCC up to the high potential VPP. The gate line BTG1 is supplied with the high potential VPP after being supplied with the source potential VCC, without being supplied with the intermediate potential V1. This allows a rapid refreshing.

As described in the above, according to this embodiment, the bit line BL1 shown in FIG. 5 is connected to the memory cell, through which data can be input or output to or from the memory cell. The sense amplifiers 506a, 506b are connected to the bit lines BL2, /BL2, to thereby amplify data on the bit lines BL2, /BL2. The switching transistors 504a, 504b connect or disconnect the bit line BL1 and so forth, connected to the memory cell, and the bit line BL2 and so forth, connected to the sense amplifier. The switching transistors 504a, 504b operates differently in a first memory cell access operation (reading) and in a second memory cell access operation (refreshing). More specifically, the gate voltage is raised earlier in the refreshing than in the reading.

The memory cell is selected depending on voltage level of the word line WL. The switching transistor 504a, 504b raise, in the reading, the gate voltage after the memory cell is selected, and raise, in the refreshing, the gate voltage before the memory cell is selected.

The sense amplifier 506a, 506b activate when the source voltage is aupplied. The switching transistor 504a, 504b raise, in the reading, the gate voltage after the sense amplifier 506a, 506b are activated, and raise, in the refreshing, the gate voltage before the sense amplifier 506a, 506b are activated.

By making difference in the control of the gate line BTG1 of the switching transistors 504a, 504b between the reading (FIG. 6) and refreshing (FIG. 7), speeds of the refreshing is increased as compared with that for the case where the control of the gate line BTG1 are set same. This makes it possible to generally increase the access speed of the semiconductor storage device. For example, making difference in the operations of the switching transistors between the reading and refreshing is successful in raising the refreshing speed. As a consequence, the refreshing completes within a short period even when the timings of the read command 302 and refresh command 301 overlap as shown in FIG. 3, and the read time T1 can be shortened. This makes it possible to generally raise the access speed of the pseudo SRAM.

It is to be understood that all of the embodiments described in the above are merely examples of the materialization in view of carrying out the present invention, by which the present invention should not limitedly be interpreted. That is, the present invention can be carried out in various forms, without departing from the technical spirit and the principal features of the present invention.

INDUSTRIAL APPLICABILITY

By making difference in the operations of the switching transistors between the first and second memory cell access operations, speeds of the first and second memory cell access operations are increased as compared with those for the case where the operations of the switching transistors are set same. This makes it possible to generally increase the access speed of the semiconductor storage device. For example, making difference in the operations of the switching transistors between the reading and refreshing is successful in raising the refreshing speed.

What is claimed is:

1. A semiconductor storage device comprising:
    a memory cell storing data;
    bit lines connected to said memory cell, allowing therethrough data input or output to or from said memory cell;
    a sense amplifier connected to said bit line, amplifying data on said bit line; and
    a switching transistor connecting or disconnecting said bit line connected to said memory cell to or from said bit line connected to said sense amplifier,
    wherein said switching transistor operates differently in a first memory cell access operation and in a second memory cell access operation.

2. A semiconductor storage device comprising:
    a memory cell storing data;
    bit lines connected to said memory cell, allowing therethrough data input or output to or from said memory cell;
    a sense amplifier connected to said bit line, amplifying data on said bit line; and
    a switching transistor connecting or disconnecting said bit line and said sense amplifier,
    wherein said switching transistor operates differently in a first memory cell access operation and in a second memory cell access operation.

3. The semiconductor storage device according to claim 2, wherein said first and second memory cell access operations are reading and refreshing, respectively.

4. The semiconductor storage device according to claim 3, wherein said switching transistor has a gate, a source and a drain, said source and said drain being connected to said bit lines, and a voltage of said gate being raised earlier in the refreshing operation than in the reading operation.

5. The semiconductor storage device according to claim 4, wherein said memory cell is selected based on a voltage level of a word line, in the reading operation said gate voltage of the switching transistor is raised after said memory cell is selected, and in the refreshing operation said gate voltage of the switching transistor is raised before said memory cell is selected.

6. The semiconductor storage device according to claim 5, wherein in the reading operation said gate voltage of the switching transistor is raised to a voltage level equal to or higher than a supply voltage supplied to the sense amplifier after said memory cell is selected, and in the refreshing operation said gate voltage of the switching transistor is a voltage level equal to or higher than the supply voltage supplied to the sense amplifier before said memory cell is selected.

7. The semiconductor storage device according to claim 4, wherein in the reading operation said gate voltage of the switching transistor is raised after the sense amplifier is activated, and In the refreshing operation said gate voltage of the switching transistor is raised before the sense amplifier is activated.

8. The semiconductor storage device according to claim 7, wherein in the reading operation said gate voltage of the switching transistor is raised to a voltage level equal to or higher than a supply voltage supplied to the sense amplifier after the sense amplifier is activated, and in the refreshing operation said gate voltage of the switching transistor is raised to a voltage level equal to or higher than the supply voltage supplied to the sense amplifier before the sense amplifier is activated.

9. The semiconductor storage device according to claim 8, wherein said gate voltage of the switching transistor is raised to the voltage level higher than the supply voltage of the sense amplifier in the reading operation and the refreshing operation in order to restore the data on said bit line into said memory cell.

10. The semiconductor storage device according to claim 8,
    wherein said sense amplifier is activated in accordance with being supplied with the source voltage.

11. The semiconductor storage device according to claim 2, further comprising a refresh circuit refreshing said memory cell.

12. The semiconductor storage device according to claim 2,
    wherein said memory cell has a transistor and a capacitor.

13. The semiconductor storage device according to claim 2, configured as a pseudo SRAM (static random access memory).

14. A semiconductor storage device comprising:
    a memory cell storing data;
    bit lines connected to said memory cell;
    a sense amplifier connected to said bit line, amplifying data on said bit line;
    a first switching transistor connecting or disconnecting said bit line and said sense amplifier; and
    a second switching transistor connecting to said sense amplifier,
    wherein said first switching transistor operates differently in a first memory cell access operation and in a second memory cell access operation.

15. The semiconductor storage device according to claim 14,
    wherein in the reading operation said gate voltage of the first switching transistor is raised to a voltage level equal to or higher than a supply voltage supplied to the sense amplifier after said memory cell is selected or after the sense amplifier is activated, and in the refreshing operation said gate voltage of the first switching transistor is a voltage level equal to or higher than the supply voltage supplied to the sense amplifier before said memory cell is selected or before the sense amplifier is activated.

16. The semiconductor storage device according to claim 14,
    wherein in the reading operation said gate voltage of the second switching transistor is lowered to a voltage level lower than the supply voltage of me sense amplifier before said memory cell is selected or before the sense amplifier is activated.

17. A semiconductor storage device comprising:
    a memory cell to store data;
    a first bit line connected to the memory cell;
    a second bit line;
    a sense amplifier connected to the second bit line to amplify the data on the second bit line; and a switching transistor disposed between the first and second bit lines to connect or disconnect the memory cell and the sense amplifier, wherein the switching transistor operates differently in a first memory cell access operation and in a second memory cell access operation.

18. A semiconductor storage device comprising:

a first memory cell array storing data;

a second memory cell array storing data;

a first bit line connected to the first memory cell array;

a second bit line connected to the second memory cell array;

a first switching transistor connected to the first bit line;

a second switching transistor connected to the second bit line; and a sense amplifier connected to the first bit line and the second bit line and disposed between the first switching transistor and the second switching transistor;

wherein said first switching transistor operates differently in a first memory cell access operation and in a second memory cell access operation.

19. The semiconductor storage device according to claim 18, further comprising a control circuit connected to the first and second transistors, to configured to control the first and second switching transistors, the control circuit makes the first transistor turn on and the second transistor turn off respectively when the memory cell in the first memory cell array is selected.

20. The semiconductor storage device according to claim 18, wherein the first switching transistor includes a first gate terminal and the second switching transistor includes a second gate terminal.

21. The semiconductor storage device according to claim 20, wherein a voltage of the first gate terminal is supplied a voltage which is higher than a source voltage before said memory cell is selected or before the sense amplifier is activated.

22. The semiconductor storage device according to claim 20, further comprising a control circuit to supply a voltage which is higher than a source voltage to the first gate terminal before said memory cell is selected or before the sense amplifier is activated.

23. A semiconductor storage device comprising:

a first memory cell array storing data;

a second memory cell array storing data;

a first bit line connected to the first memory cell array;

a second bit line connected to the second memory cell array;

a first switching transistor connected to the first bit line, including a first gate terminal;

a second switching transistor connected to the second bit line; and a sense amplifier connected to the first bit line and the second bit line and disposed between the first switching transistor and the second switching transistor;

wherein a voltage of the first gate terminal is supplied a voltage which is higher than a source voltage before said memory cell is selected or before the sense amplifier is activated.

* * * * *